(12) United States Patent
Ishikura (10) Patent No.: US 9,545,019 B2
(45) Date of Patent: Jan. 10, 2017

(54) HOUSING AND HOUSING COMPONENT (71) Applicant: SONY CORPORATION, Tokyo (JP)

(72) Inventor: Masayuki Ishikura, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 4 days.

(21) Appl. No.: 14/468,592

(22) Filed: Aug. 26, 2014

(65) Prior Publication Data

US 2015/0061476 A1  Mar. 5, 2015

(30) Foreign Application Priority Data

Sep. 4, 2013 (JP) ................. 2013-183238

(51) Int. Cl.
*A47B 81/00* (2006.01)
*A47B 97/00* (2006.01)
*H05K 5/00* (2006.01)

(52) U.S. Cl.
CPC .................. *H05K 5/0004* (2013.01)

(58) Field of Classification Search
CPC .. H05K 5/0013; H05K 5/0004; H05K 5/0221; H04M 1/0252
USPC ......... 312/223.1, 223.2; 455/575.8; 220/4.02
See application file for complete search history.

(56) References Cited

U.S. PATENT DOCUMENTS

| | | | | |
|---|---|---|---|---|
| 4,759,466 A | * | 7/1988 | Chase et al. | 220/4.02 |
| 4,972,508 A | * | 11/1990 | King | 455/351 |
| 5,469,982 A | * | 11/1995 | Gordecki et al. | 220/4.02 |
| 5,613,237 A | * | 3/1997 | Bent et al. | 455/351 |
| 5,931,514 A | * | 8/1999 | Chung | 292/89 |
| 5,946,395 A | * | 8/1999 | Petrella et al. | 379/433.01 |
| 6,111,760 A | * | 8/2000 | Nixon | 361/814 |
| 6,315,142 B1 | * | 11/2001 | Kitamura et al. | 220/4.02 |
| 6,375,283 B1 | * | 4/2002 | Kitamura et al. | 312/7.1 |
| 6,483,719 B1 | * | 11/2002 | Bachman | 361/816 |
| 6,876,543 B2 | * | 4/2005 | Mockridge et al. | 455/347 |
| 7,149,306 B2 | * | 12/2006 | Pan | 379/433.01 |
| D534,909 S | * | 1/2007 | Weiher et al. | D14/356 |
| 7,236,588 B2 | * | 6/2007 | Gartrell | 379/433.01 |
| 7,522,889 B2 | * | 4/2009 | Wulff et al. | 455/90.3 |
| 7,647,079 B2 | * | 1/2010 | Zuo et al. | 455/575.1 |
| 7,660,560 B2 | * | 2/2010 | Zuo et al. | 455/90.3 |
| 7,712,621 B2 | * | 5/2010 | Cho et al. | 220/4.28 |
| 7,986,982 B2 | * | 7/2011 | Li et al. | 455/575.1 |
| 8,101,859 B2 | * | 1/2012 | Zadesky | 174/50 |
| 8,164,898 B2 | * | 4/2012 | Chen et al. | 361/679.55 |
| 8,366,213 B2 | * | 2/2013 | Iwai et al. | 312/7.2 |
| 8,373,985 B2 | * | 2/2013 | Lamers et al. | 361/679.56 |
| 8,480,186 B2 | * | 7/2013 | Wang | 312/223.1 |
| 8,701,279 B2 | * | 4/2014 | Filson et al. | 29/830 |
| 2004/0203518 A1 | * | 10/2004 | Zheng et al. | 455/90.3 |
| 2006/0292439 A1 | * | 12/2006 | Zuo et al. | 429/97 |
| 2008/0239647 A1 | * | 10/2008 | Luo et al. | 361/683 |

(Continued)

FOREIGN PATENT DOCUMENTS

JP  H11-054950 A  2/1999

*Primary Examiner* — Daniel J Troy
*Assistant Examiner* — Kimberley S Wright
(74) *Attorney, Agent, or Firm* — Chip Law Group (57) ABSTRACT

There is provided a housing including a first housing part including a first side wall, and a second housing part including a second side wall. The first side wall includes a first protruding part on an inner circumferential surface. The second side wall includes, on an outer circumferential surface, a first concave part into which the first protruding part is fitted.

8 Claims, 9 Drawing Sheets

(56) References Cited

U.S. PATENT DOCUMENTS

| | | | |
|---|---|---|---|
| 2010/0091439 A1* | 4/2010 | Horii | 361/679.01 |
| 2010/0264786 A1* | 10/2010 | Cheng | 312/223.1 |
| 2010/0270305 A1* | 10/2010 | Yamamoto | B65D 43/0204 220/315 |
| 2011/0249377 A1* | 10/2011 | Weng et al. | 361/679.01 |
| 2014/0062273 A1* | 3/2014 | Lee et al. | 312/223.1 |
| 2014/0084762 A1* | 3/2014 | Lai | 312/223.1 |

\* cited by examiner

HOUSING AND HOUSING COMPONENT

CROSS REFERENCE TO RELATED APPLICATIONS

This application claims the benefit of Japanese Priority Patent Application JP 2013-183238 filed Sep. 4, 2013, the entire contents of which are incorporated herein by reference.

BACKGROUND

The present disclosure relates to a housing and a housing component.

Various types of housing have been recently developed. For example, there is a housing including a plurality of housing parts. As an example of the housing including a plurality of housing parts, such a housing is disclosed that includes a protruding part on a second-housing-part facing surface of a side wall of a first housing part, the protruding part being fitted into a groove on a side wall of a second housing part (see, for example, JP H11-54950A).

SUMMARY

It is, however, desired to provide a technique capable of further enhancing the strength of a housing.

According to an embodiment of the present disclosure, there is provided a housing including a first housing part including a first side wall, and a second housing part including a second side wall. The first side wall includes a first protruding part on an inner circumferential surface. The second side wall includes, on an outer circumferential surface, a first concave part into which the first protruding part is fitted.

According to another embodiment of the present disclosure, there is provided a housing component including a first side wall including a first protruding part on an inner circumferential surface. The first protruding part is fitted into a first concave part on an outer circumferential surface of a second side wall of another housing component.

According to still another embodiment of the present disclosure, there is provided a housing component including a second side wall including a first concave part on an outer circumferential surface. A first protruding part on an inner circumferential surface of a first side wall of another housing component is fitted into the first concave part.

According to one or more of embodiments of the present disclosure, there is provided a technique capable of further enhancing the strength of a housing. The above-mentioned advantageous effects are not necessarily limited, but any other effects that are shown in the present specification or can be grasped from the present specification may also be attained in combination with or instead of the above-mentioned advantageous effects.

DETAILED DESCRIPTION OF THE EMBODIMENT(S)

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

The description will be made in the following order.
1. First Embodiment (First Housing Part Includes Single-Framed Side Wall)
   1.1. Overview of Housing
   1.2. First Protruding Part and First Concave Part
   1.3. Fixing Member
   1.4. Connected Housing
2. Second Embodiment (First Housing Part Includes Double-Framed Side Wall)
   2.1. Second Protruding Part and Second Concave Part
3. Conclusion

1. FIRST EMBODIMENT

First, a first embodiment of the present disclosure will be described.

[1.1. Overview of Housing]

Figure 1:
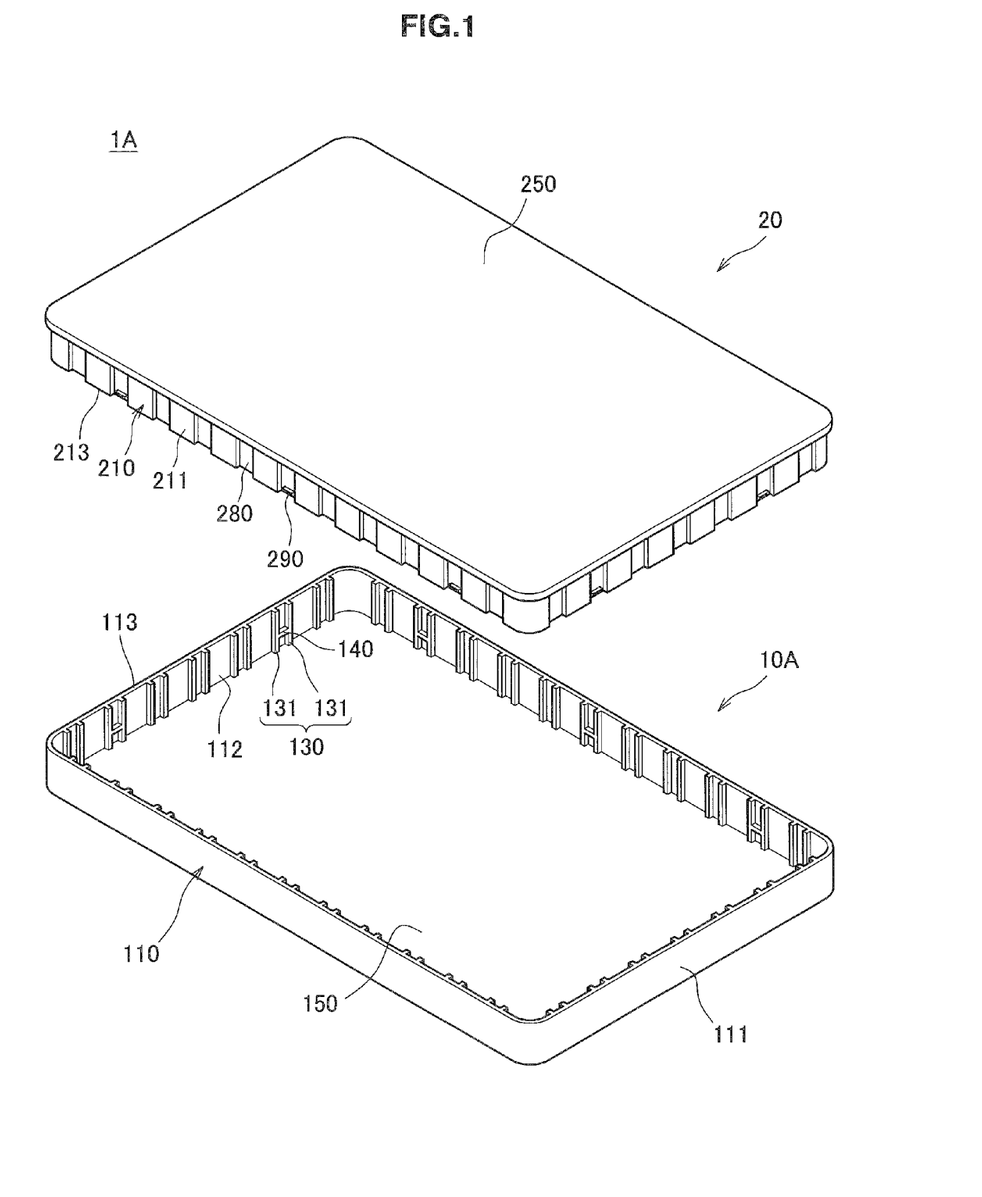
FIG. 1 is an exploded perspective view of a housing according to a first embodiment of the present disclosure.
Figure 2:
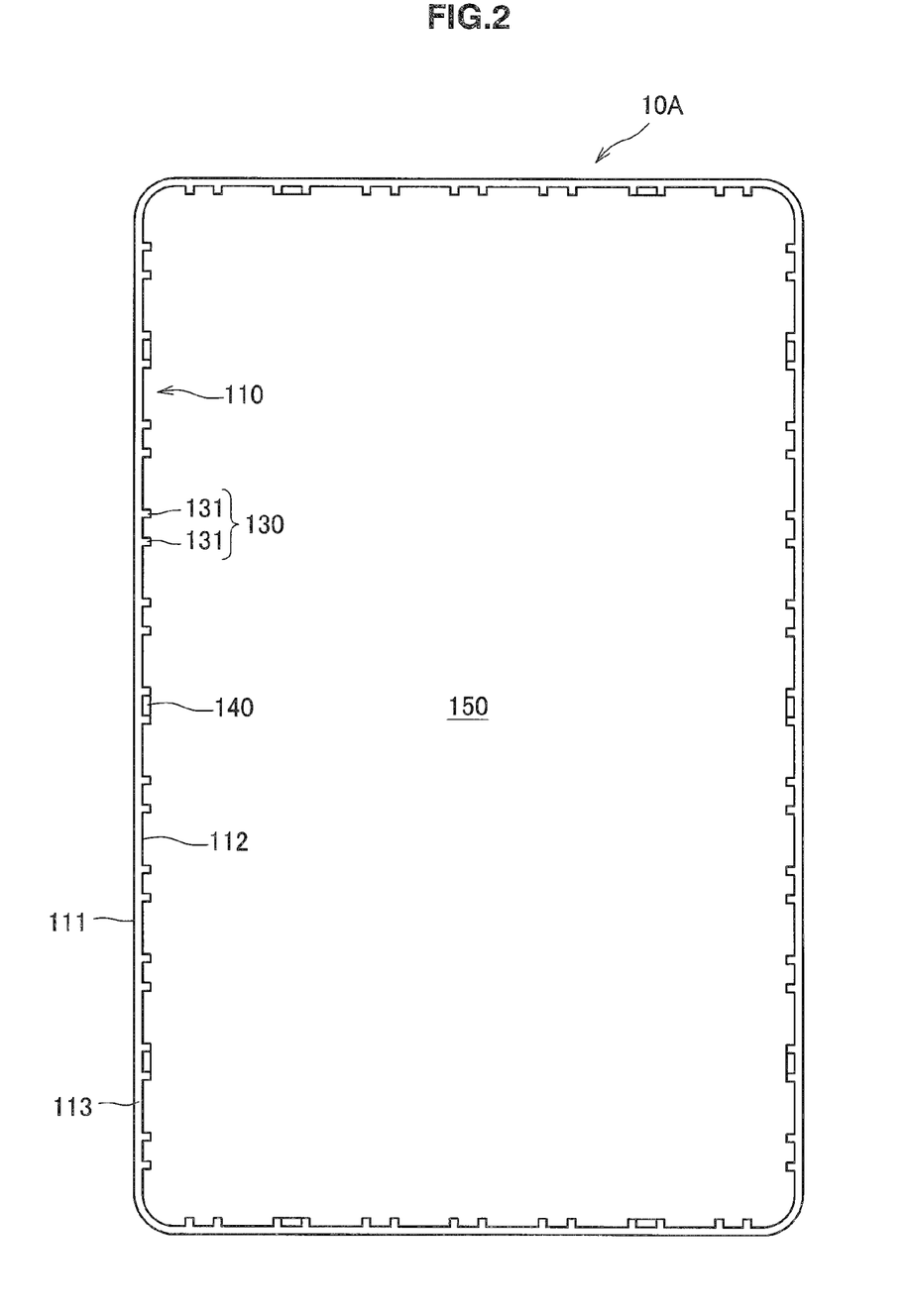
FIG. 2 is a view of a first housing part seen from a second housing part.

First, an overview of a housing 1A according to the first embodiment of the present disclosure will be described. FIG. 1 is an exploded perspective view of the housing 1A according to the first embodiment of the present disclosure. FIG. 1 shows that the housing 1A includes a first housing part 10A and a second housing part 20. FIG. 2 is a view of the first housing part 10A seen from the second housing part 20, while FIG. 3 is a view of the second housing part 20 seen from the first housing part 10A.

FIGS. 1 and 2 have shown that the first housing part 10A includes a first side wall 110 and a tabular part 150. Although FIGS. 1 and 2 have shown that the tabular part 150 is substantially rectangular with the rounded corners, the tabular part 150 may also be rectangular with the sharp corners or may have any shape other than rectangles. The tabular part 150 does not necessarily have to have a flat surface, but the surface may be curved.

FIGS. 1 and 2 have also shown that the first side wall 110 is provided around the circumference of the tabular part 150. Although the first side wall 110 vertically stands on the tabular part 150 in the examples of FIGS. 1 and 2, the first side wall 110 may be inclined with respect to the tabular part 150. FIGS. 1 and 2 have shown that the first side wall 110 has an outer circumferential surface 111, an inner circumferential surface 112, and a second-housing-part facing surface 113.

Figure 3:
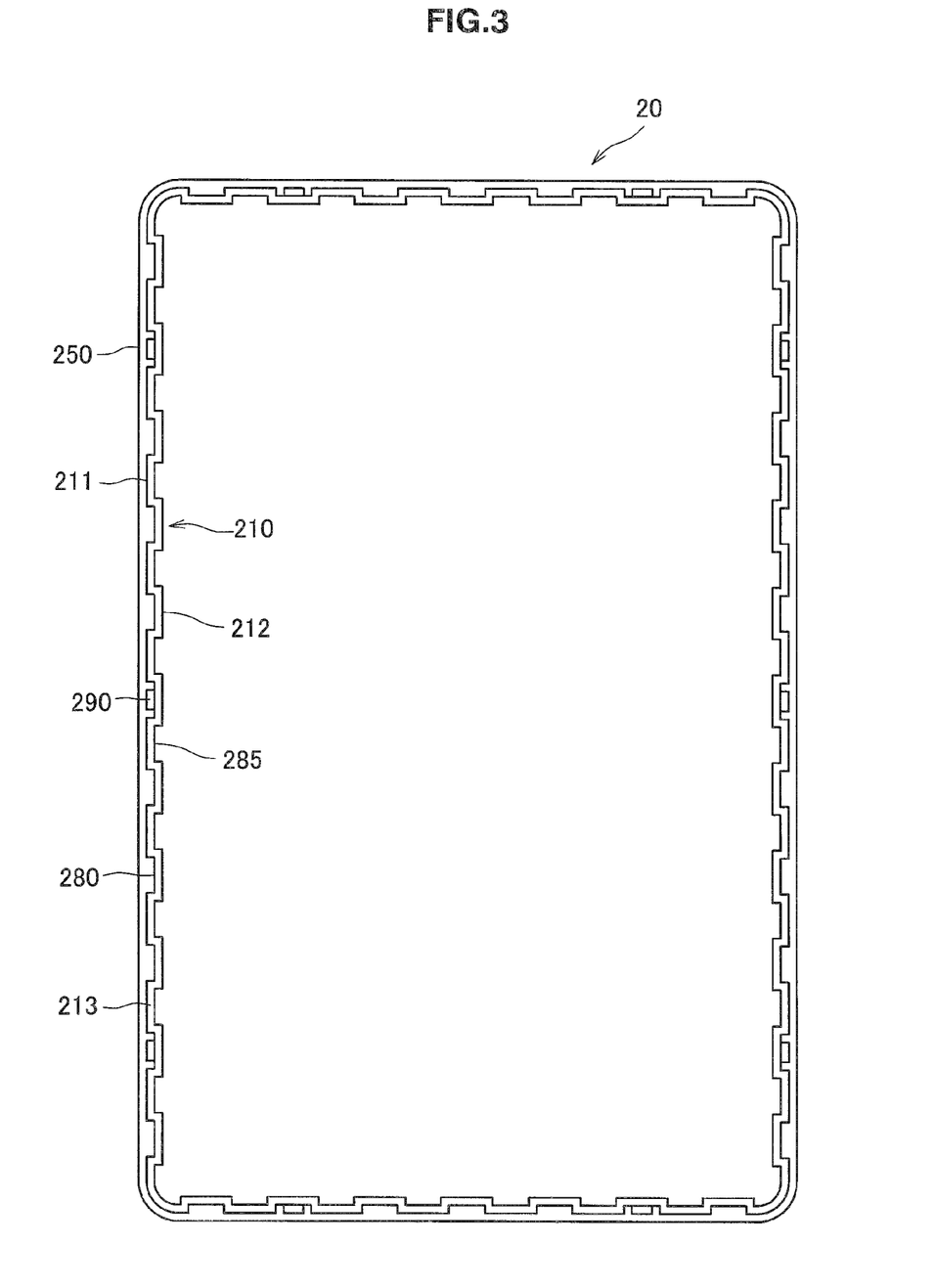
FIG. 3 is a view the second housing part seen from the first housing part.

FIGS. 1 and 3 have shown that the second housing part 20 includes a second side wall 210 and a tabular part 250. Although FIGS. 1 and 3 have shown that the tabular part 250 is substantially rectangular with the rounded corners, the tabular part 250 may also be rectangular with the sharp corners or may have any shape other than rectangles. The tabular part 250 does not necessarily have to have a flat surface, but the surface may be curved.

FIGS. 1 and 3 have shown that the second side wall 210 is provided around the circumference of the tabular part 250. Although the second side wall 210 vertically stands on the tabular part 250 in the examples of FIGS. 1 and 3, the second side wall 210 may be inclined with respect to the tabular part 250. FIG. 3 has shown that the second side wall 210 has an outer circumferential surface 211, an inner circumferential surface 212, and a first-housing-part facing surface 213.

When the first housing part 10A is connected to the second housing part 20, the space surrounded by the first side wall 110, the tabular part 150, the second side wall 210, and the tabular part 250 can accommodate a variety of objects. A type of object accommodated in the space is not limited in particular. Electronic circuits may be included. The housing 1A may be, thus, a housing for a variety of electronic apparatuses. Examples of the electronic apparatuses may include electronic calculators, cards from which data can be read out by read-out apparatuses, and mobile terminals such as mobile phones.

A protruding part is usually formed on the second-housing-part facing surface 113, and is fitted into a groove on the second side wall 210 to form the housing. The second-housing-part facing surface 113 may be, for example, the same as the thickness of the first side wall 110. Accordingly, when the thickness is narrow, the protruding part is likely to be thin and long in the direction vertical to the second-housing-part facing surface 113. Thus, it is not easy to enhance the strength of the housing.

The technique capable of further enhancing the strength of the housing will be primarily described in the first embodiment of the present disclosure. The strength of the housing may be the proof stress against force applied from outside of the housing. The force applied from outside of the housing may include various force such as force of bending the housing, force of twisting the housing, and force of compressing the housing. The overview of the housing 1A according to the first embodiment of the present disclosure has been described so far.

[1.2. First Protruding Part and First Concave Part]

Next, the technique for enhancing the strength of the housing will be described in detail. FIGS. 1 and 2 have shown that the first side wall 110 includes the first protruding part 130 on the inner circumferential surface 112 in the first embodiment of the present disclosure. FIGS. 1 and 3 have also shown that the second side wall 210 includes the first concave part 280 on the outer circumferential surface 211. When the first housing part 10A is connected to the second housing part 20, the first protruding part 130 is fitted into the first concave part 280.

According to the configuration, the inner circumferential surface 112 can be wide enough to form the first protruding part 130, so that the first protruding part 130 is unlikely to be thin and long in the direction vertical to the inner circumferential surface 112. Thus, the strength of the housing can be further enhanced. Since the first side wall 110 and the second side wall 210 function as a double-framed wall, the strength of the housing can be further enhanced. Moreover, no special devices or components have to be prepared for the creation of the housing. Accordingly, a simple approach can enhance the strength of the housing.

The number of first protruding parts 130 is not limited in particular. One or more first protruding parts 130 may be used. The examples of FIGS. 1 and 2 have shown that the first side wall 110 standing on each short side of the tabular part 150 includes seven first protruding parts 130, while the first side wall 110 standing on each long side of the tabular part 150 includes eleven first protruding parts 130. The number of first concave parts 280 is not also limited in particular. For example, as many first concave parts 280 as first protruding parts 130 may only be formed.

Figure 4:
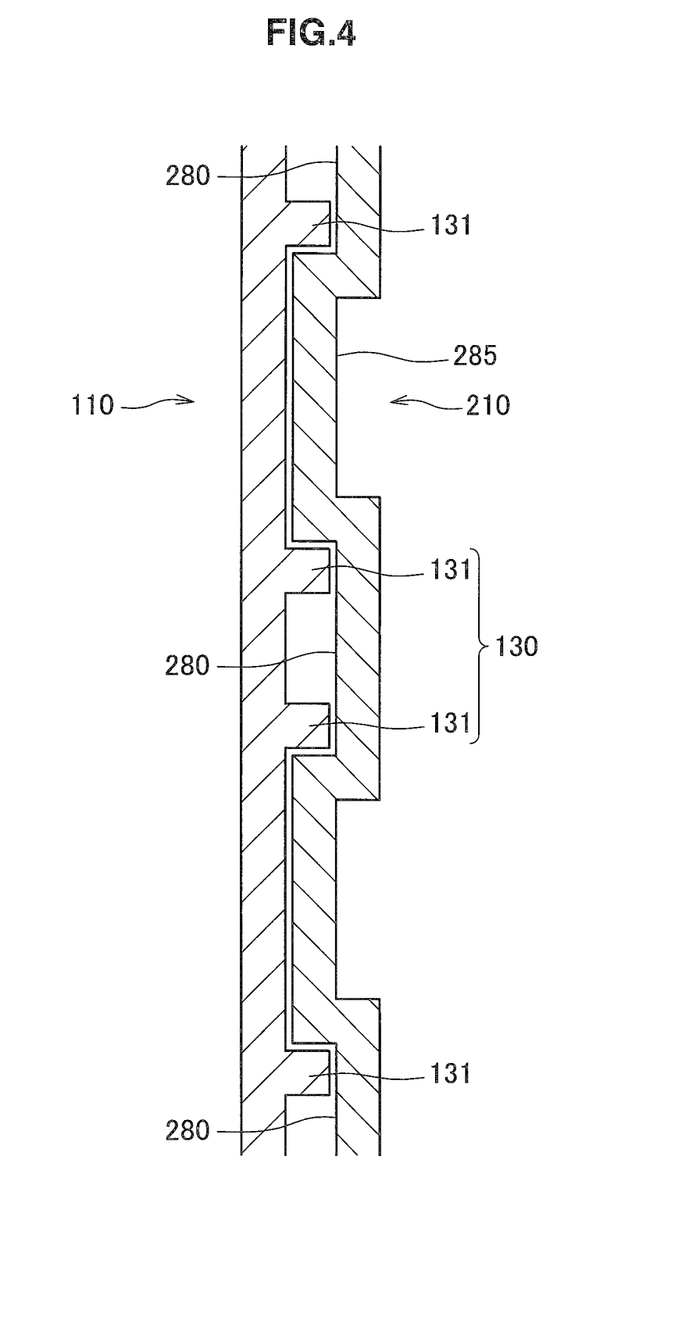
FIG. 4 is an enlarged transverse sectional view of fitted parts where a first protruding part is fitted into a first concave part.

Fitting the first protruding part 130 into the first concave part 280 will be further described in detail. FIG. 4 is an enlarged transverse sectional view of the fitted parts where the first protruding part 130 is fitted into the first concave part 280. FIG. 4 shows that each first protruding part 130 includes two ribs 131. The number of ribs 131 of the first protruding part 130 is not, however, limited in particular. Thus, for example, the first protruding part 130 may only include one or more ribs 131. The one or more ribs 131 are fitted into the first concave part 280, and the strength of the fitted parts can be enhanced. The rib described herein refers to a member vertically attached to a plane.

It is more desired that the first protruding part 130 include a plurality of ribs 131. Compared with one thick rib of the first protruding part 130, the plurality of ribs 131 of the first protruding part 130 lead to a decrease in thick portions of the first side wall 110. This can reduce the possibility of shrink marks at the time of molding the first housing part 10A.

When the first protruding part 130 includes the plurality of ribs 131, the concave part 280 into which the ribs 131 are fitted becomes larger in width. Accordingly, thick portions of the second side wall 210 are decreased, which can reduce the possibility of shrink marks at the time of molding the second housing part 20. An increase in the width of the first concave part 280 can enhance the mold release property at the time of molding the second side wall 210.

The increased number of ribs 131 of the first protruding part 130 may enlarge the space created between the first side wall 110 and the second side wall 210. Too ample the space created between the first side wall 110 and the second side wall 210 is likely to diminish the strength of the portions around this space. FIG. 4 has shown that when the two ribs 131 of the first protruding part 130 creates narrower space between the first side wall 110 and the second side wall 210 and it is also possible to prevent the strength of the portions around this space from being diminished.

It has been already discussed that the outer circumferential surface 211 of the second housing part 20 includes the first concave part 280. FIG. 3 shows that the inner circumferential surface 212 of the second housing part 20 also includes the second concave part 285, and the inner circumferential surface 212 also includes concave and convex parts that fit concave and convex parts on the outer circumferential surface 211. When the second side wall 210 alternately includes the first concave parts 280 and the second concave parts 285 at least on the portion thereof in this way, thick portions of the second side wall 210 decreases and it is possible to reduce the possibility of shrink marks at the time of molding the second housing part 20.

[1.3. Fixing Member]

As described so far, the first protruding part 130 on the first side wall 110 is fitted into the first concave part 280 on the outer circumferential surface 211 of the second side wall 210, which can further enhance the strength of the housing 1A. An additional configuration may also be included for enhancing the strength of the housing 1A.

For example, each of the first housing part 10A and the second housing part 20 may include a fixing member that prevents the first housing part 10A from separating from the second housing part 20. The example of FIG. 1 shows that the first housing part 10A includes a fixing member 140, while the second housing part 20 includes a fixing member 290. Once the first housing part 10A is connected to the second housing part 20, the fixing member 290 is fixed to the fixing member 140, which is expected to further enhance the strength of the housing 1A. The fixing members may be claw-shaped, or may have other shapes.

Figure 5:
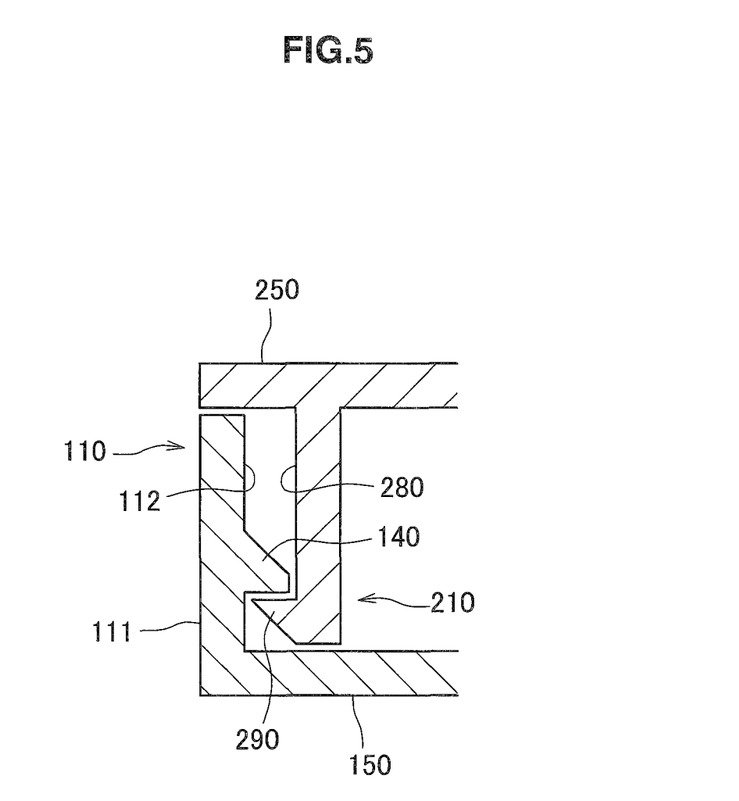
FIG. 5 is an enlarged longitudinal sectional view of fixed parts where the first protruding part is fitted into the first concave part.

The fixing member 290 fixed to the fixing member 140 will be further described in detail. FIG. 5 is an enlarged longitudinal sectional view of the fixed parts where the first protruding part 130 is fitted into the first concave part 280. FIG. 5 shows that the fixing member 290 is fixed to the fixing member 140, which prevents the first wall side 110 from separating from the second side wall 110.

The example of FIG. 3 has shown that the first side wall 110 standing on each short side of the tabular part 150 includes two fixing members 140, while the first side wall 110 standing on each long side of the tabular part 150 includes three fixing members 140. The number of fixing members 140 is not, however, limited in particular. Although the fixing member 140 is attached between the two ribs 131 of the first protruding part 130 in the example of FIG. 3, a position of the fixing member 140 is not also limited in particular.

[1.4. Connected Housing]

Figure 6:
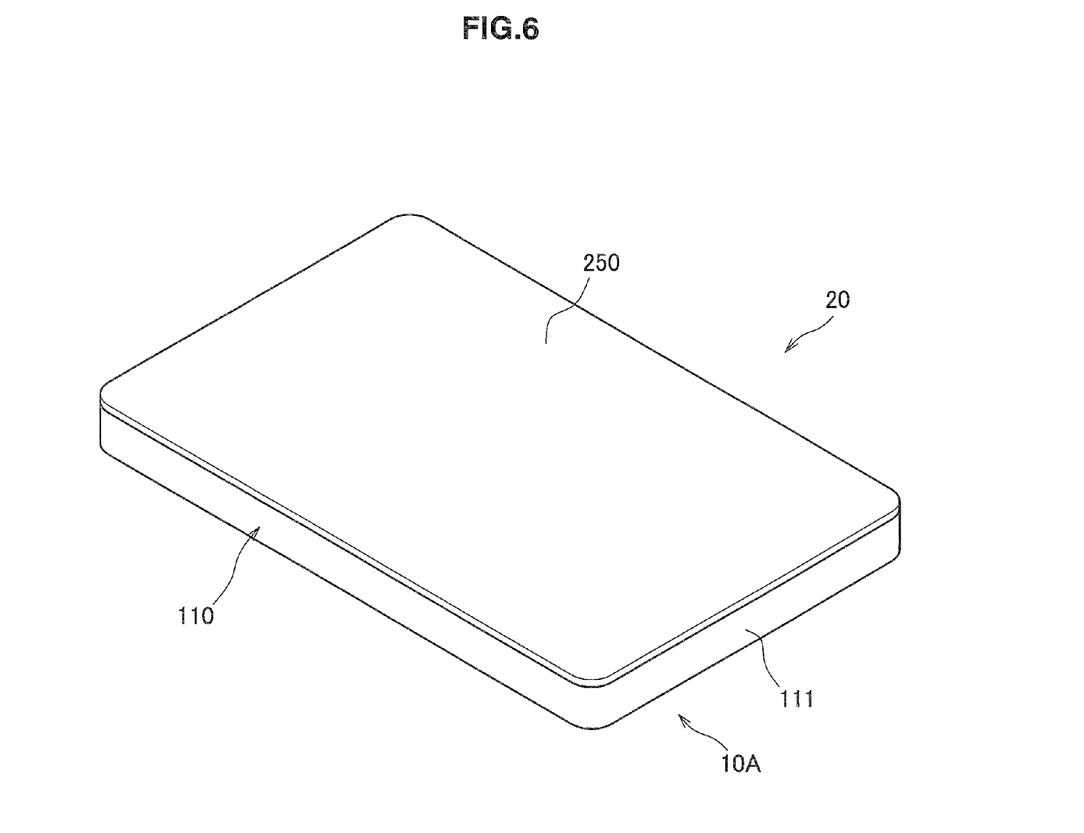
FIG. 6 is a perspective view of the housing having the first protruding part fitted into the first concave part.

As described so far, the first protruding part 130 is fitted into the first concave part 280, so that the strength of the housing 1A can be enhanced. The fixing member 290 is fixed to the fixing member 140, so that the strength of the housing 1A can be further enhanced. FIG. 6 is a perspective view of the housing 1A having the first housing part 10A connected to the second housing part 20. FIG. 6 has shown that when the first housing part 10A is connected to the second housing part 20, the first protruding part 130 is fitted to the first concave part 280, so that the strength of the housing 1A is enhanced. The fixing member 290 is also fixed to the fixing member 140, so that the strength of the housing 1A is further enhanced.

The first embodiment of the present disclosure has been described so far.

2. SECOND EMBODIMENT

Next, a second embodiment of the present disclosure will be described.

Figure 7:
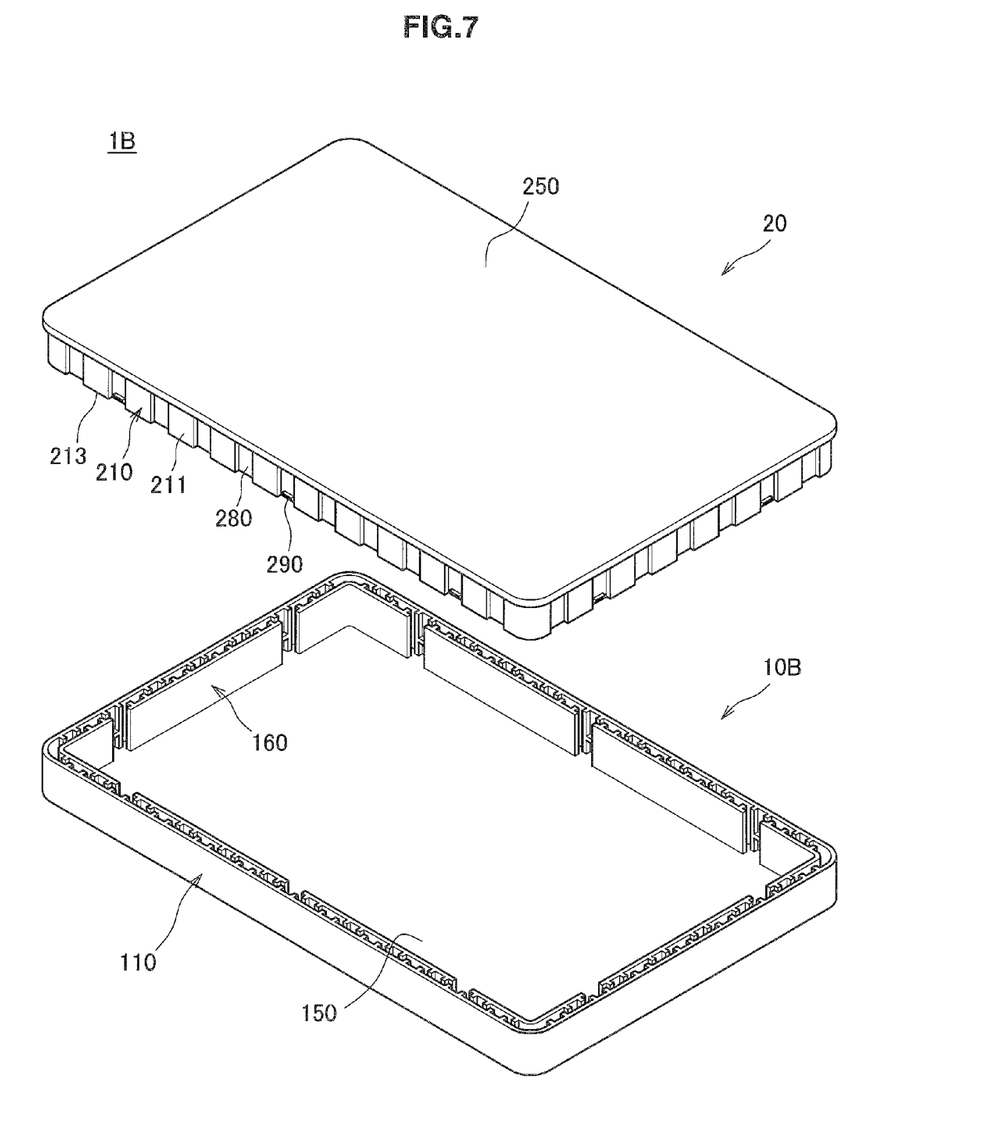
FIG. 7 is an exploded perspective view of a housing according to a second embodiment of the present disclosure.

FIG. 7 is an exploded perspective view of a housing 1B according to the second embodiment of the present disclosure. FIG. 7 shows that the housing 1B includes a first housing part 10B and a second housing part 20. As in the first embodiment of the present disclosure, the housing 1B includes the second housing part 20 in the second embodiment of the present disclosure. The housing 1B, however, includes the first housing part 10B, which is different from the first housing part 10A, in the second embodiment of the present disclosure. Accordingly, the first housing part 10B will be primarily described in the second embodiment of the present disclosure.

Figure 8:
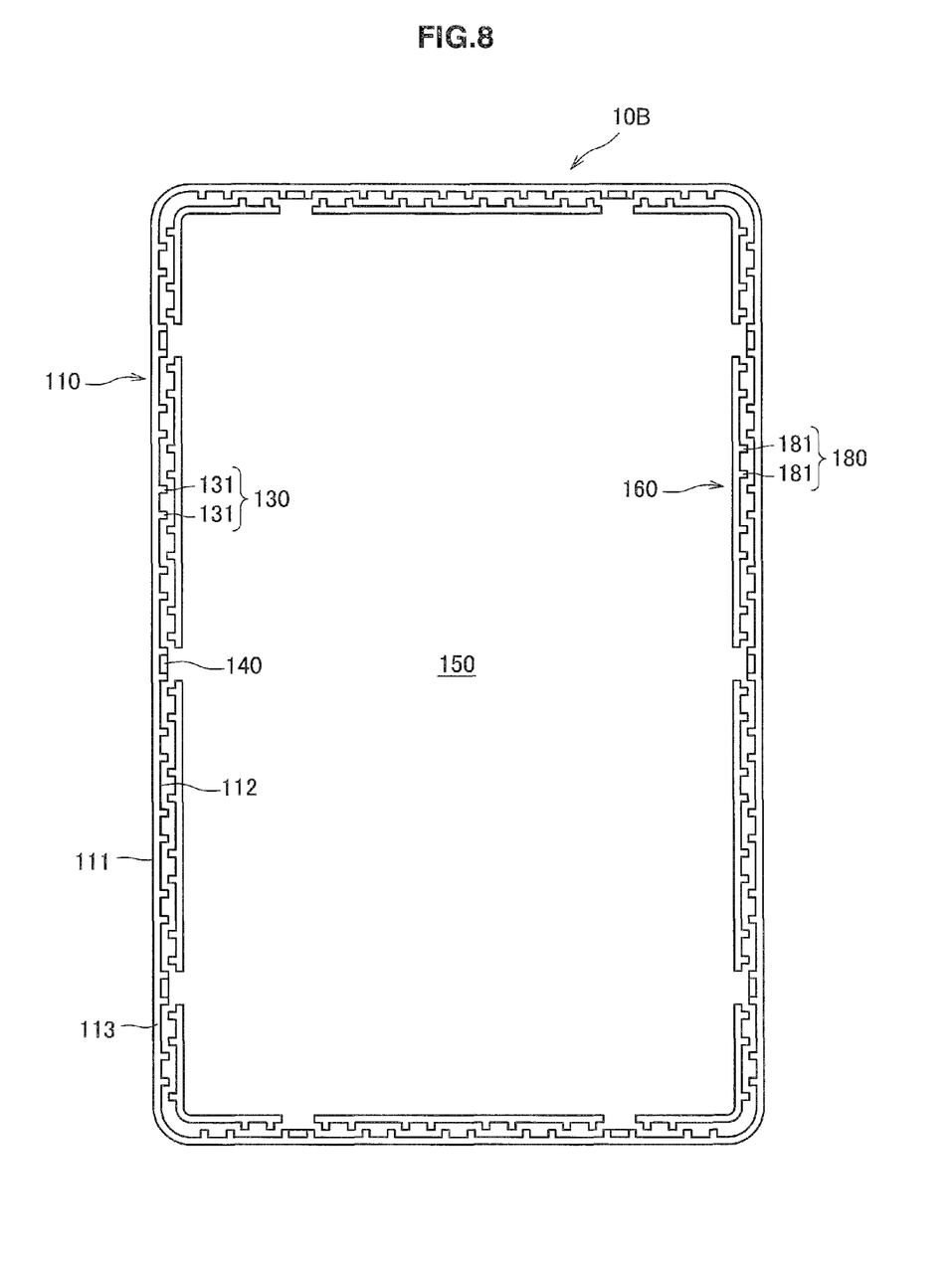
FIG. 8 is a view of a first housing part seen from a second housing part.

FIG. 8 is a view of the first housing part 10B seen from the second housing part 20. FIGS. 7 and 8 have shown that the first housing part 10B includes a first side wall 110 and a tabular part 150 like the first housing part 10A according to the first embodiment of the present disclosure. The first housing part 10B includes a third side wall 160 interior to the first side wall 110. Although the third side wall 160 vertically stands on the tabular part 150 in the examples of FIGS. 7 and 8, the third side wall 160 may be inclined with respect the tabular part 150.

When the first housing part 10B is connected to the second housing part 20, the space surrounded by the third side wall 160, the tabular part 150, the second side wall 210, and the tabular part 250 can accommodate a variety of objects. As in the first embodiment of the present disclosure, a type of object accommodated in the space is not limited in particular in the second embodiment of the present disclosure.

[2.1. Second Protruding Part and Second Concave Part]

Next, the technique for further enhancing the strength of the housing will be described in detail. FIG. 8 has shown that the third side wall 160 includes the second protruding part 180 on the outer circumferential surface in the second embodiment of the present disclosure. FIG. 8 has also shown that the third side wall 160 includes the second protruding part 180 on the outer circumferential surface. When the first housing part 10B is connected to the second housing part 20, the second protruding part 180 is fitted into the second concave part 285.

According to the configuration, the strength of the housing can be further enhanced. The first side wall 110, the second side wall 210, and the third side wall 160 function as a triple-framed wall, which can further enhance the strength of the housing. In particular, the third side wall 160 of the first housing part 10B supports the inner portions of the second side wall 210 of the second housing part 20. This can further reduce the possibility of the inward transformation of the second side wall 210, and reduce the possibility of the separation of the second side wall 210 from the first housing part 10B.

The number of second protruding parts 180 is not limited here in particular. One or more second protruding parts 180 may be used. The example of FIG. 8 has shown that the third side wall 160 standing on each short side of the tabular part 150 includes six second protruding parts 180, while the third side wall 160 standing on each long side of the tabular part 150 includes ten second protruding parts 180. The number of second concave parts 285 is not also limited in particular. For example, as many second concave parts 285 as second protruding parts 180 may only be formed.

Figure 9:
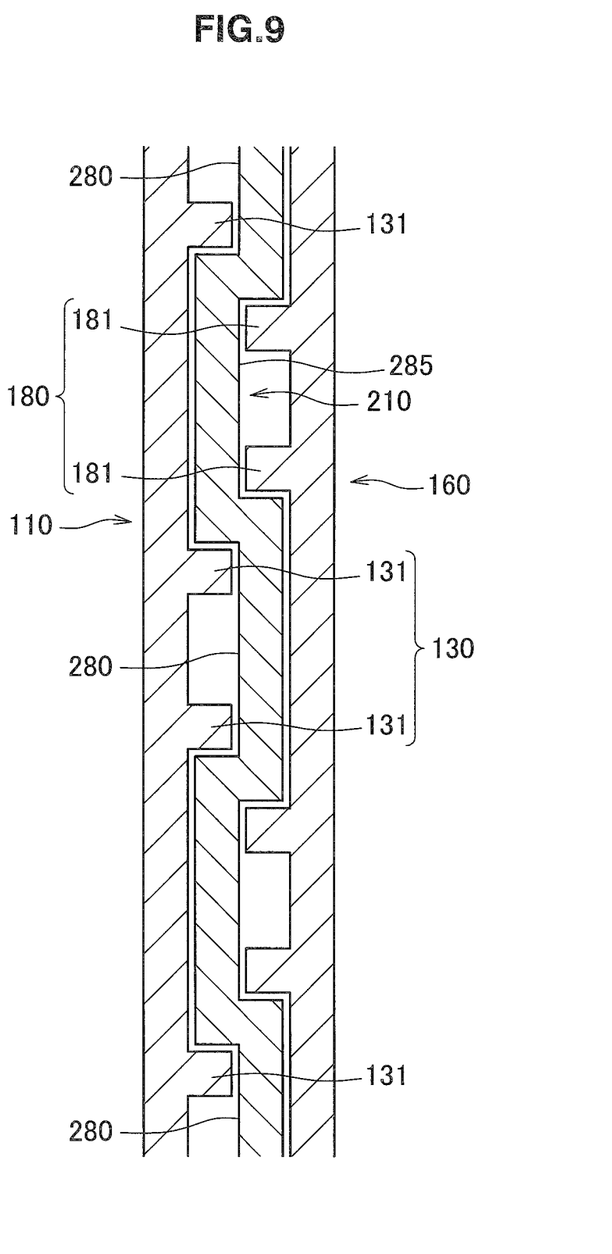
FIG. 9 is an enlarged transverse sectional view of fitted parts where a first protruding part is fitted into a first concave part and a second protruding part is fitted into a second concave part.

Fitting the second protruding part 180 into the second concave part 285 will be further described in detail. FIG. 9 is an enlarged transverse sectional view of the fitted parts where the first protruding part 130 is fitted into the first concave part 280 and the second protruding part 180 is fitted into the second concave part 285. FIG. 9 shows that each second protruding part 180 includes two ribs 181, but the number of ribs 181 of the second protruding part 180 is not limited in particular. Thus, for example, the second protruding part 180 may only include one or more ribs 181. The one or more ribs 181 are fitted into the second concave part 285, which can enhance the strength of the fitted parts.

It is more desired that the second protruding part 180 include a plurality of ribs 181. Compared with one thick rib of the second protruding part 180, the plurality of ribs 181 of the second protruding part 180 lead to a decrease in thick portions of the third side wall 160. This can reduce the possibility of shrink marks at the time of molding the first housing part 10B.

When the second protruding part 180 includes a plurality of ribs 181, the second concave part 285 into which the ribs 181 are fitted becomes larger in width. Accordingly, thick portions of the second side wall 210 are decreased. This can reduce the possibility of shrink marks at the time of molding the second housing part 20. An increase in the width of the second concave part 285 can enhance the mold release property at the time of molding the second side wall 210.

Meanwhile, the increased number of ribs 181 of the second protruding part 180 may enlarge the space created between the third side wall 160 and the second side wall 210. Too ample the space created between the third side wall 160 and the second side wall 210 is likely to diminish the strength of the portions around this space. FIG. 9 has shown that the two ribs 181 of the second protruding part 180 creates narrower space between the third side wall 160 and the second side wall 210 and it is also possible to prevent the strength of the portions around this space from being diminished.

3. CONCLUSION

According to the first embodiment of the present disclosure as described so far, the housing 1A is provided that includes the first housing part 10A equipped with the first side wall 110 and the second housing part 20 equipped with the second side wall 210. The first side wall 110 includes the first protruding part 130 on the inner circumferential surface 112, while the second side wall 210 includes the first concave part 280 into which the first protruding part 130 is fitted on the outer circumferential surface 211.

According to the configuration, the inner circumferential surface 112 can be wide enough to form the first protruding part 130, so that the first protruding part 130 is unlikely to be thin and long in the direction vertical to the inner circumferential surface 112. The strength of the housing can be thus further enhanced. Since the first side wall 110 and the second side wall 210 function as a double-framed wall, the strength of the housing can be further enhanced. Moreover, no special devices or components have to be prepared for the creation of the housing. Accordingly, a simple approach can enhance the strength of the housing.

Moreover, according to the second embodiment of the present disclosure, the first housing 1B is provided where the first housing part 10B includes the third side wall 160 interior to the first side wall 110, the third side wall 160 includes the second protruding part 180 on the outer circumferential surface, and the second side wall 210 includes the second concave part 285 into which the second protruding part 180 is fitted on the inner circumferential surface 212.

According to the configuration, it is possible to further enhance the strength of the housing. The first side wall 110, the second side wall 210, and the third side wall 160 function as a triple-framed wall, which can further enhance the strength of the housing. In particular, the third side wall 160 of the first housing part 10B supports the inner portions of the second side wall 210 of the second housing part 20. This can reduce the possibility of the inward transformation of the second side wall 210, and reduce the possibility of the separation of the second side wall 210 from the first housing part 10B.

Although the preferred embodiments of the present disclosure have been described in detail with reference to the appended drawings, the present disclosure is not limited thereto. It is obvious to those skilled in the art that various modifications or variations are possible insofar as they are within the technical scope of the appended claims or the equivalents thereof. It should be understood that such modifications or variations are also within the technical scope of the present disclosure.

The first embodiment has described, for example, that the first housing part 10A and the second housing part 20 each include a fixing member that prevents the first housing part 10A from separating from the second housing part 20. Another approach may be used instead of the fixing member or in combination with the fixing member in order to prevent the first housing part 10A from separating from the second housing part 20. For example, an adhesive may fix the first housing part 10A to the second housing part 20.

Likewise, an adhesive may fix the first housing part 10B to the second housing part 20 in the second embodiment. In that case, the second side wall 210 may be inserted into between the first side wall 110 and the third side wall 160 after an adhesive is injected into between the first side wall 110 and the third side wall 160. An adhesive is injected into between the first side wall 110 and the third side wall 160 in this way, which can reduce the possibility that the adhesive leaks.

A decrease in the width of a groove created between the first side wall 110 and the third side wall 160 can reduce the possibility that liquid (such as water) gets into the housing 1A or the housing 1B. The narrowed groove created between the first side wall 110 and the third side wall 160 can, thus, cause the housing 1A or the housing 1B to perform a simple waterproof function.

The first housing part 10A may function as a housing component for the creation of the housing 1A. In that case, the second housing part 20 may function as another housing component. The first housing part 10 may also function as a housing component for the creation of the housing 1B. In that case, the second housing part 20 may function as another housing component.

Likewise, the second housing part 20 may function as a housing component for the creation of the housing 1A. In that case, the first housing part 10A may function as another housing component. The second housing part 20 may also function as a housing component for the creation of the housing 1B. In that case, the first housing part 10B may also function as another housing component.

The effects described herein are merely explanatory and illustrative, and not limited. The technology according to an embodiment of the present disclosure may attain other effects obvious to those skilled in the art from the present specification in addition to the above-described effects or instead thereof.

Additionally, the present technology may also be configured as below:

(1) A housing including:
  a first housing part including a first side wall; and
  a second housing part including a second side wall,
  wherein the first side wall includes a first protruding part on an inner circumferential surface, and
  wherein the second side wall includes, on an outer circumferential surface, a first concave part into which the first protruding part is fitted.

(2) The housing according to (1),
  wherein the first housing part includes a third side wall interior to the first side wall,
  wherein the third side wall includes a second protruding part on an outer circumferential surface, and
  wherein the second side wall includes, on an inner circumferential surface, a second concave part into which the second protruding part is fitted.

(3) The housing according to (2),
wherein the first protruding part and the second protruding part each include at least one rib.
(4) The housing according to (3),
wherein the first protruding part and the second protruding part each include more than one rib.
(5) The housing according to any one of (2) to (4),
wherein the second side wall alternately includes the first concave parts and the second concave parts at least on a portion of the second side wall.
(6) The housing according to any one of (1) to (5),
wherein the first housing part and the second housing part each include a fixing member capable of preventing the first housing part from separating from the second housing part.
(7) A housing component including:
a first side wall including a first protruding part on an inner circumferential surface,
wherein the first protruding part is fitted into a first concave part on an outer circumferential surface of a second side wall of another housing component.
(8) A housing component including:
a second side wall including a first concave part on an outer circumferential surface,
wherein a first protruding part on an inner circumferential surface of a first side wall of another housing component is fitted into the first concave part.

What is claimed is:

1. A housing, comprising:
a first housing part that includes a first side wall; and
a second housing part that includes a second side wall,
wherein the first side wall includes a plurality of first protruding parts on an inner circumferential surface,
wherein the second side wall includes an outer circumferential surface and a first housing part facing surface,
wherein the second side wall further includes, on the outer circumferential surface, a plurality of first concave parts into which respective first protruding parts of the plurality of first protruding parts are fitted,
wherein the first housing part further includes a third side wall interior to the first side wall,
wherein the second side wall of the second housing part is configured to insert between the first side wall and the third side wall of the first housing part,
wherein the second side wall includes, on an inner circumferential surface, a plurality of second concave parts,
wherein the third side wall includes a plurality of second protruding parts on an outer circumferential surface,
wherein respective second protruding parts of the plurality of second protruding parts are fitted into the plurality of second concave parts, and
wherein the plurality of first concave parts and the plurality of second concave parts are alternatively arranged at least on a portion of the second side wall.

2. The housing according to claim 1, wherein the plurality of first protruding parts and the plurality of second protruding parts each include at least one rib.

3. The housing according to claim 2, wherein the plurality of first protruding parts and the plurality of second protruding parts each include more than one rib.

4. The housing according to claim 1, wherein the first housing part and the second housing part each include a fixing member that prevents separation of the first housing part from the second housing part.

5. The housing according to claim 1, wherein the first side wall is continuous along a circumference of the first housing part.

6. The housing according to claim 1, wherein the second side wall is continuous along a circumference of the second housing part.

7. A housing component, comprising:
a first side wall that includes a plurality of first protruding parts on an inner circumferential surface,
wherein respective first protruding parts of the plurality of first protruding parts are fitted into a plurality of first concave parts on an outer circumferential surface of a second side wall of another housing component,
wherein the second side wall of said other housing component includes a housing component facing surface and the outer circumferential surface,
wherein the housing component further includes a third side wall interior to the first side wall,
wherein the second side wall of said other housing component is configured to insert between the first side wall and the third side wall of the housing component,
wherein the second side wall includes, on an inner circumferential surface, a plurality of second concave parts,
wherein the third side wall includes a plurality of second protruding parts on an outer circumferential surface,
wherein respective second protruding parts of the plurality of second protruding parts are fitted into the plurality of second concave parts, and
wherein the plurality of first concave parts and the plurality of second concave parts are alternatively arranged at least on a portion of the second side wall.

8. A housing component, comprising:
a first side wall that includes an outer circumferential surface and an another housing component facing surface,
wherein the first side wall further includes a plurality of first concave parts on the outer circumferential surface,
wherein first protruding parts among a plurality of first protruding parts on an inner circumferential surface of a second side wall of another housing component are respectively fitted into the plurality of first concave parts,
wherein the other housing component further includes a third side wall interior to the second side wall,
wherein the first side wall of the housing component is configured to insert between the second side wall and the third side wall of the other housing component,
wherein the first side wall includes, on an inner circumferential surface, a plurality of second concave parts,
wherein the third side wall includes a plurality of second protruding parts on an outer circumferential surface,
wherein respective second protruding parts of the plurality of second protruding parts are fitted into the plurality of second concave parts, and
wherein the plurality of first concave parts and the plurality of second concave parts are alternatively arranged at least on a portion of the first side wall.

* * * * *